US008313968B2

(12) United States Patent
Elgawadi

(10) Patent No.: US 8,313,968 B2
(45) Date of Patent: Nov. 20, 2012

(54) FABRICATION OF GAN AND III-NITRIDE ALLOYS FREESTANDING EPILAYERS MEMBRANES USING A NONBONDING LASER

(76) Inventor: Amal Elgawadi, Stillwater, OK (US)

( * ) Notice: Subject to any disclaimer, the term of this patent is extended or adjusted under 35 U.S.C. 154(b) by 0 days.

(21) Appl. No.: 12/674,404

(22) PCT Filed: Aug. 20, 2008

(86) PCT No.: PCT/US2008/073718
§ 371 (c)(1),
(2), (4) Date: May 4, 2011

(87) PCT Pub. No.: WO2009/026366
PCT Pub. Date: Feb. 26, 2009

(65) Prior Publication Data
US 2011/0201180 A1 Aug. 18, 2011

Related U.S. Application Data

(60) Provisional application No. 60/956,953, filed on Aug. 21, 2007.

(51) Int. Cl.
*H01L 21/00* (2006.01)
(52) U.S. Cl. .............. 438/46; 438/47; 438/93; 438/94; 257/183; 257/E21.403; 257/E21.405
(58) Field of Classification Search .............. 438/46, 438/47, 93, 94, 172; 257/183, 189, 200, 257/201, E21.403, E21.405
See application file for complete search history.

(56) References Cited

U.S. PATENT DOCUMENTS

| 7,136,407 | B2 | 11/2006 | Choi |
| 7,187,014 | B2 * | 3/2007 | Hirose et al. .................. 257/192 |
| 2006/0049335 | A1 | 3/2006 | Suchiro et al. |
| 2006/0073621 | A1 * | 4/2006 | Kneissel et al. ................ 438/21 |
| 2006/0270075 | A1 | 11/2006 | Leem |
| 2007/0093037 | A1 | 4/2007 | Zhu et al. |

OTHER PUBLICATIONS

Korean Intellectual Property Office, "International Search Report for PCT/US2008/073718", Feb. 20, 2009.
Korean Intellectual Property Office, "Written Opinion of the International Searching Authority for PCT/US2008/073718", Feb. 20, 2009.

* cited by examiner

*Primary Examiner* — Hsien Ming Lee
(74) *Attorney, Agent, or Firm* — Fellers, Snider, Blankenship, Bailey & Tippens, P.C.

(57) ABSTRACT

Using a laser lift-off (LLO) nonbonding technique, freestanding 4-layer GaN/AlGaN heterostructure membranes have been formed. A 4×4 mm mask was attached to the area at the center of the most-upper AlGaN layer was attached using a nonbonding material such as vacuum grease. A microscopic slide attached by an adhesive provided support for the structure during the laser lift-off without bonding to the layers. The vacuum grease and the mask isolated the adhesive from the structure at the center. The microscopic slide served as a temporarily nonbonding handle substrate. Laser lift-off of the sapphire substrate from the heterostructures was performed. The remaining adhesive served as a supporting frame for the structure making a free-standing 4-layer GaN/AGaN heterostructure membrane. Other frameless freestanding membranes can be fabricated for a variety of applications including further III-nitride growth, heterogeneous integration, packaging of micro systems, and thin film patterns.

12 Claims, 3 Drawing Sheets

Sample # 1

Sample # 2

FABRICATION OF GAN AND III-NITRIDE ALLOYS FREESTANDING EPILAYERS MEMBRANES USING A NONBONDING LASER

FIELD OF THE INVENTION

The field of the invention is the general area of semiconductor device fabrication.

BACKGROUND OF THE INVENTION

Wide band gap III-V nitride semiconductors are used for green, blue, and UV light-emitting diodes (LEDs), sensors, and laser diodes (LDs). They are also used for high temperature, high-power, high-frequency electronic devices and nanotechnology.

The most commonly used substrate for III-nitride epilayers is sapphire. Unfortunately, due to the lattice and thermal expansion coefficient mismatches between sapphire and GaN-based materials, a high density of extended defects occur at the GaN/sapphire interface. Cooling from growth temperature to room temperature strains the GaN layer. The overall effect of the residual strain generated on the surface of GaN epilayer grown on the sapphire is a biaxial compressive strain. This strain induced dislocations that originate at the GaN/sapphire interface, and extended vertically with its highest density at the interface.

A high density of dislocations degrades the preparation and operation of the epilayers, heterostructures and quantum-well based optoelectronic devices. Removing the substrate reduces the dislocation density from $10^8$ cm$^{-2}$ to below $10^7$ cm$^{-2}$. In addition, sapphire has poor thermal and electrical conductivities. Furthermore, sapphire is difficult to dice since it is hard and does not cleave easily. Hence, it is desirable to eliminate the sapphire substrate and obtain a GaN freestanding membrane that can be used now as a matched substrate for GaN. In addition, the elimination of the sapphire substrate allows the transfer of the heterostructure to a substrate with superior thermal, mechanical, or electrical properties, a requirement for some applications. Removal of the substrate also exposes the backside of the heterostructure, allowing for the implementation of "active packaging" schemes. See M. K. Kelly, O. Ambacher, R. Dimitrov, R. Handschuh, and M. Stutzmann, Phys. Stat. Sol. (a) 159, R3 (1997). Layer transfer also enables the assembly of micro systems.

Laser lift-off (hereinafter "LLO") technology, of sapphire is commonly used to reduce the dislocation density to below $10^7$ cm$^{-2}$. The GaN layer is separated from the sapphire substrate and then is used as a freestanding GaN substrate. Though this technology is sophisticated and expensive, it produces GaN substrates with dislocation density of about $10^6$ cm$^{-2}$ and reduces thermal stresses in devices. Such two-inch substrates are already available and they serve for construction of blue lasers of a power of hundreds of milliwatts.

Decomposition of GaN can result in thermo-mechanical failures. The basic idea of the removal of sapphire from GaN epilayer or heterostructure is that a pulsed laser irradiation causes the decomposition of GaN into gaseous nitrogen (N$_2$) and metallic gallium (Ga) droplets. The thermal and mechanical behaviors during pulsed laser irradiation must be considered for successful LLO and layer transfer (i.e. to obtain damage free GaN lifted layer or freestanding membrane).

Tavernier and Clarke reported that that the N$_2$ pressure can become significant at fluence that are significantly higher than the minimum necessary to induce decomposition. The impact of the high pressure on the LLO mechanism at the GaN/interface could be one or more of the following mechanical constraints: (1) film bulging (2) Fracture of the film or (3) blistering due to tensile failure at the center of a buckle or bulge. Any of these effects constitutes a failure mechanism for most applications of LLO. See P. R. Tavernier & D. R. Clarke, *Mechanics of laser-assisted debonding of films*, J. Appl. Phys. 89, 31, 1527 (2001), and T. Sands, W. S. Wong, and N. W. Cheung, *Laser Liftoff of Gallium Nitride from Sapphire Substrates*, available at http://www.ucop.edu/research/micro/98_99/98_133.pdf (last visited Aug. 20, 2007).

However, Tavernier and Clarke reported, "if the laser energy is just sufficient to decompose the film at the interface and cause separation without generating any appreciable N$_2$ vapor pressure, one might expect that film separation can be achieved without any damage." Tavernier & Clarke, supra. Mechanical failures were observed when Tavernier and Clarke applied fluences of 800 mJ/cm$^2$, 965 mJ/cm$^2$ and 1200 mJ/cm$^2$ to study the mechanical failures. See Sands et al., supra.

Wong et al. stated that at higher fluences above the process threshold, the violent ejection of the sapphire substrate, due to the GaN decomposition, can cause the mechanical fracture of the GaN thin film. W. S. Wong, T. Sands, and N. W. Cheung, *Damage-free separation of GaN thin films from sapphire substrates*, Appl. Phys. Lett. 72 (5), 2, 599 (1998). They also stated that with fluences greater than or equal to 400 mJ/cm$^2$, successful lift-off was accomplished. However, even using 600 mJ/cm$^2$ fluence, thermally and mechanically damage-free separation of GaN from sapphire was achieved. This indicates that even with fluence that about 30% higher than the threshold, damage free separation can be performed. Accordingly, laser irradiation that is just at the threshold fluence or slightly higher should avoid the mechanical failures. Successful separation can be obtained at fluence of approximately 400 mJ/cm$^2$.

Tavernier and Clarke have performed an extensive study on GaN separation from sapphire. See Tavernier & Clarke, supra. Prior to the LLO the GaN film bonded to a glass substrate using Crystal Bond adhesive as bonding material which based on their experience, is too flexible but is better than many other materials. Three distinct types of behavior were observed when the film was bonded with the Crystal Bond.

First, for an 800 mJ/cm$^2$ pulse, the separation occurred over the area exposed. The film had separated from the substrate and bulging had occurred, but neither lateral cracking nor film cracking was observed. It is believed that the laser pulse induced deformation of the film causes deformation of the Crystal Bond, which then, in turn, constrains the film in its deformed state. Annealing on a hot plate allows the Crystal Bond to soften and the fringes diminish as the film partially relaxes back.

Second, separation of the thin films using pulse of high energy density of 965 mJ/cm$^2$ and GaN film thickness 2 μm and evidence of local inhomogeneities in the laser beam due to multiple mode conditions have been seen. At higher pulse energies ~1200 mJ/cm$^2$ and a thicker film, extensive cracking of the film accompanied the film separation.

Third, film separation occurred using fluence of 1100 in J/cm$^2$ and the film thickness 2 μm thick. The separated film experiences a lateral crack extends along the interface from the illuminated region, and surrounding the laser decomposed region.

Based on the above study, Tavernier and Clarke have developed detailed processing maps accounting for bulging, buckling, and cracking for GaN films. The maps suggested three strategies to avoid mechanical failures for GaN films during the LLO processing. First, use a beam diameter below the critical size for the onset of cracking a non-bonded film. Second, suppression of cracking by bonding the film as described earlier. Third, start the separation at an edge of the film and move the laser in across the film so that the gas generated by the laser pulse can escape along the separated portions of the film to the edge, thereby lowering the maximum pressure attained.

Nevertheless, Tavernier and Clarke concluded, "ideally, laser-assisted separation of films would be carried out using a laser beam much larger than the size of the film or wafer so that many of the difficulties discussed in their work would be avoided. Physically, the use of a finite beam size restricts the range of laser parameters that can be employed in the separation since the regions of the film not illuminated by the laser constrain, in one way or another, the separation of the film in the illuminated region. Thus, local vaporization of the film causes internal pressures to be generated that can lead to both cracking and bulging deformation of the film."

Conventional bonding direct and double transfer laser lift-off (LLO). See Timothy D. Sands, Excimer Laser *Lift-off for Packaging and Integration of GaN-based Light-emitting Devices*, Proceedings of SPIE Vol. 4977, 587 (2003). Sands states that, "Application of LLO to heterogeneous integration requires the use of reasonably thin heterostructures that cannot be easily handled as free-standing films. It is therefore necessary to mechanically support the films throughout the film transfer process. The simplest LLO integration scheme, direct 'paste-and-cut,' starts with the permanent bonding of the heterostructure to be transferred to the final substrate. Removal of the substrate by LLO completes the transfer. If the bonding material and substrate are relatively stiff and adhesion at the interfaces is strong, any residual stress in the film will remain after LLO." Sands, supra.

Sands also reports that, "The direct transfer process described above results in a heterostructure that is inverted relative to its orientation on the growth substrate. In some cases, it may be desirable to transfer a heterostructure in its original orientation." This led to double transfer process, which Sands stated that "[s]uch a process necessarily involves the temporary transfer of the heterostructure to a handle substrate, a subsequent permanent bonding of the transferred heterostructure to a final receptor substrate, and the release of the heterostructure from the handle substrate." Sands, supra. However, as reported by Sands "The additional complexities associated with double transfer include the reduced mechanical stiffness associated with the temporary bonding material, which can lead to an increase in problems associated with blistering and crack deflection during LLO." Sands, supra.

BRIEF DESCRIPTION OF DRAWINGS

The following detailed description will be better understood in view of the enclosed drawings which depict details of preferred embodiments. It should however be noted that the invention is not limited to the precise arrangement shown in the drawings and that the drawings are provided merely as examples.

FIG. 3a illustrates schematically how the frame-like adhesive around the freestanding membrane can dissolve then cut around the freestanding membrane, or both the adhesive and the film around the freestanding membrane can dice to obtain the fully frameless freestanding membrane. FIG. 3b illustrates schematically a second method which is to attach the temporarily handling substrate to the film surface by the nonbonding material. The structure in this case is sapphire substrate/GaN epilayer(s)/nonbonding material/temporarily handling substrate. After the LLO, the temporary substrate can be removed to create a self-supported freestanding non-bonded-membrane.

DETAILED DESCRIPTION

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

Using laser lift-off (LLO) with a nonbonding technique, freestanding 4-layer GaN/AlGaN heterostructure membranes have been obtained. The method can be applied to various fabrication procedures including fabrication of GaN epilayers, III-nitride alloys with heterostructure, and quantum wells. The method allows dissimilar classes of materials to be integrated intimately.

Figure 1:
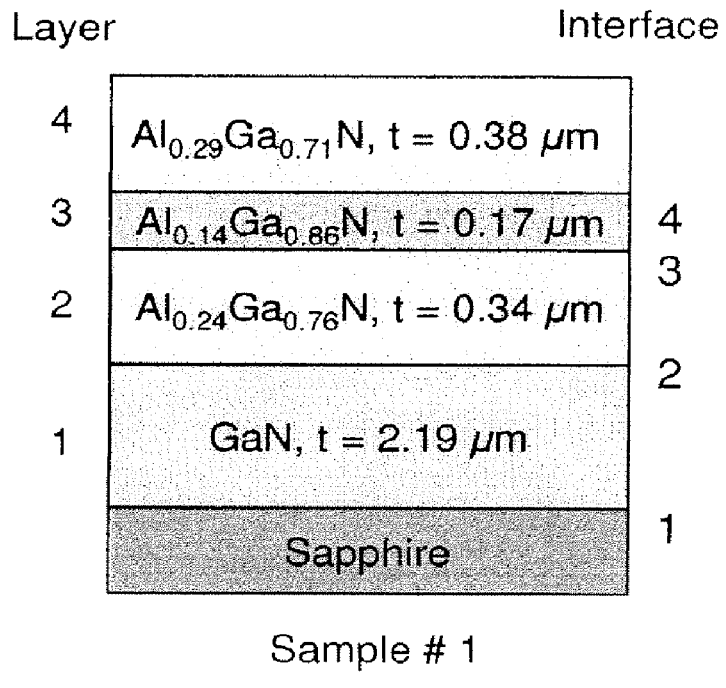
FIG. 1 is a schematic description for the 2-heterostructure samples; t is the epilayer thickness.
Figure 1:
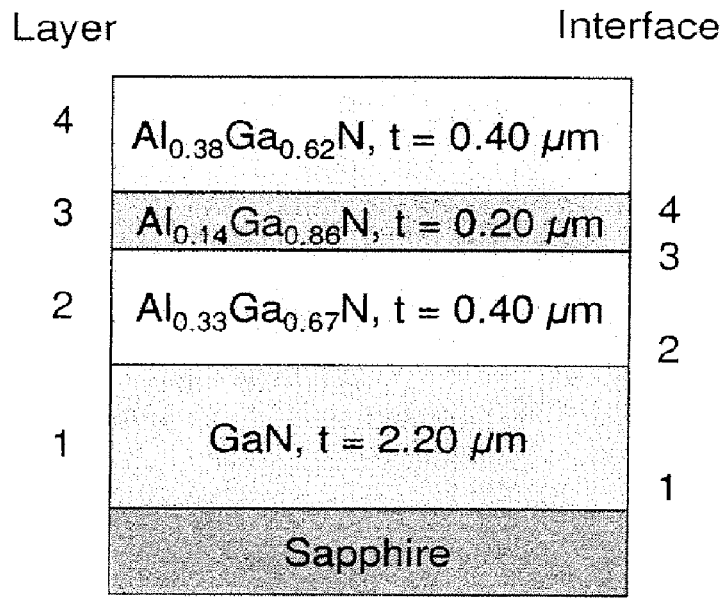
Figure 2:
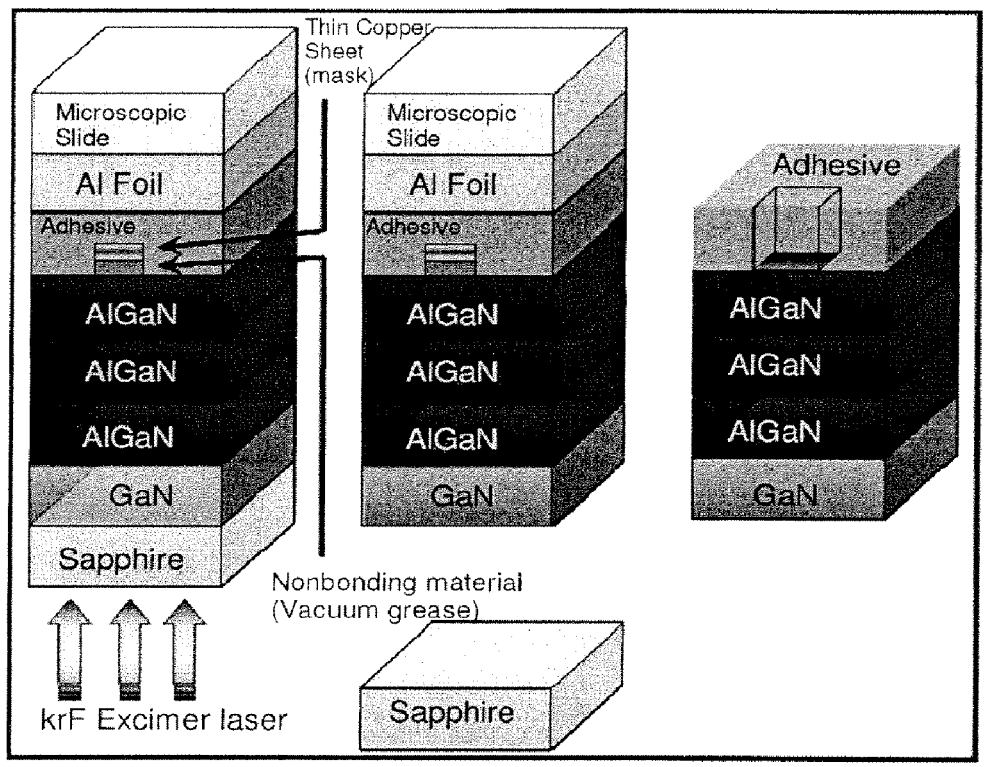
FIG. 2 is a schematic of the manufacture of a freestanding 4-layer GaN/AlGaN heterostructure membrane showing the cross-section of the structure.

Referring to FIG. 2, the method is illustrated in the fabrication of two thin 4-layer GaN/AlGaN heterostructures membranes. A 4×4 mm mask was attached to the area at the center of the most-upper AlGaN layer of the structure using a nonbonding material. Any type of mask with any various lithographic image may be applied. As an exemplar mask, a thin sheet of copper foil was used as a mask. Any nonbonding, lubricating solid or viscous material may be used such as laboratory grade vacuum grease. Referring to FIG. 2, a microscope slide is attached by an adhesive to provide a support for the structure during the laser lift-off without bonding to the layers. The vacuum grease and the mask isolated the adhesive from the structure at the center. In other words, the microscopic slide served as a temporarily nonbonding handling substrate. Standard laser lift-off of the sapphire substrate from the heterostructure was performed. The remaining adhesive served as a supporting frame for the structure making a free-standing 4-layer GaN/AGaN heterostructure membrane.

Frameless freestanding membranes can be fabricated for many applications including, but not limited to, substrates for further III-nitride growth, heterogeneous integration, packaging, microsystems, thin-film patterns. With proper selection and distribution of conductive adhesives, contact electrodes can created for electrical, electronic and optoelectronic applications. Bonding methods still can be employed. The nonbonding LLO technology provides freestanding membranes at much lower cost than the double transfer LLO.

The use of a bonding material that is too flexible will not prevent the film from binding if the laser fluence is significantly over the threshold. However, when using an overly flexible bonding material, the removal of the residual stress by the LLO might be sustained. On the other hand, the use of a stiff bonding material may not release the unwanted residual stresses although it might prevent the film from sustaining mechanical failure if the film is subject to fluence much higher than the threshold. Careful selection of the bonding materials is required.

In some applications, the bonding materials must be a metal to create sufficient electrical and thermal contacts. Selection of a proper bonding material requires consideration of a wide range of material considerations. The bonding layer must have the following characterizations: (1) low resistance, (2) adherent to both the GaN epilayer and the final receptor substrate, (3) does not leave behind undesired components or phase, (4) a resulting bond that has low electrical resistance, (5) the bonding material must be thinner than the heterostructure so that the properties of the bonding layer does not dominate those of the thin film.

On the other hand, in most applications of the LLO, freestanding GaN epilayer or heterostructure is required or an access to the original orientation of the heterostructure is necessary. If the bonding method is used, the double transfer LLO must be performed to have a freestanding epilayer. Nevertheless, in addition to the complexity, time requirements, and cost of the double transfer LLO process, the removing of the stiff bonding material will cause any reduced mechanical failures to return. In other words, any reduction in the mechanical failure from the bonding must be sacrifice in order to have freestanding membrane.

Therefore, it is more reliable to avoid the causes of the thermomechanical failures in the first place. Consequently, no need for the double transfer process and no needs for bonding unless permanent transfer to a receptor substrate is required. Thermomechanical failures should not appear if the LLO is performed under the following conditions:

First, the film should be irradiated at the threshold fluence or slightly higher. This should generate the required temperature for GaN decomposition, approximately 890° C.2 Peak temperature rise of about 1000° C. can be achieved without appreciable heating of the GaN material that is more than a few thermal diffusion lengths away from the interface. The estimated temperatures at about 100 nm and 500 nm from GaN/sapphire interface are 1000° C. and 700° C. respectively in GaN material when irradiation of a GaN/sapphire interface with a 38 ns pulse from a 248 nm laser at a fluence of 600 mJ/cm$^2$ incident on the sapphire entrance surface was used. This condition should prevent violent $N_2$ pressure and associated mechanical failures.

Second, the laser beam should cover the whole area of the film or the wafer from sapphire side so that the whole film is exposed at same time and the heat is distributed homogenously at the interface. Therefore, all location on the film/sapphire erface can reach the required decomposition temperature simultaneously. This should eliminate the effect of the fluctuations in the local vapor pressures.

Third, the film or the wafer should move or rotate steadily during the irradiation. So that the beam distributes evenly over the sapphire substrate and thus any effect of inhomogeneities in the laser beam can be recovered.

Under these conditions, the interface should properly and uniformly irradiated and heated. Therefore, a moderate vapor pressure is evenly distributed. Thus, no internal local pressures that can lead to both cracking and bulging deformation. This also should generate a consistent concurrent and simultaneous decomposition rate of GaN across the interface, which should lead to a successful damage free LLO.

The process to fabricate a freestanding GaN epilayer(s) by the nonbonding LLO method is sapphire substrate/GaN epilayer(s)/nonbonding material/thin-mask/adhesive/thin aluminum foil/temporarily handling substrate, is illustrated schematically in FIG. 2. To prepare the heterostructure for LLO the following structure was formed: Sapphire substrate/GaN/AlGaN/AlGaN/AlGaN/vacuum grease/thin-copper-mask/adhesive/thin Al foil/microscopic slide, as seen in FIG. 2. The microscopic slide was used to temporarily support the sample during LLO procedures. The temporarily substrate is to be used to support the GaN epilayer(s) during LLO handling procedures. Aluminum foil is to be used to wrap the temporarily substrate, so that the temporarily substrate does not bond to the adhesive, but supports the structure during the LLO process and flattens the adhesive. The aluminum foil was used to wrap the microscopic slide, so that the temporarily substrate did not bond to the adhesive, but supported the structure temporally during LLO process and flattened the adhesive. The adhesive was a Durabond 950 metallic ceramic composite. Using the nonbonding material (e.g. vacuum grease), a thin-layer-mask is attached temporarily to the surface of the layer to isolate the surface from the adhesive. LLO was performed at room temperature using a 248 nm, 20 ns pulse KrF Lambda Physik Excimer laser. Successful separation was obtained at a fluence of approximately 400 mJ/cm$^2$. The heterostructure was placed on a motorized stage with the sapphire facing the beam. A 300 mm focal length fused silica plano-convex lens was used to spread the beam through the polished sapphire faces of the samples, so that the beam covers the entire area of the sample. LLO yields metallic Ga and $N_2$ gas as decomposition components. The separated surface was etched using a 1:1 solution of HCl and de-ionized water to remove Ga. After LLO, the upper part of the aluminum foil is to be cut and the temporarily handling substrate is to be removed. After LLO, the upper part of the Aluminum foil was cut gently using a cutter and the microscopic slide was removed. The Aluminum foil was dissolved using the HCl solution in seconds. The remaining Aluminum foil layer is to be dissolved using a proper solvent. Small drops of a proper solvent are to be applied on the adhesive just above the mask. Small drops of the HCl solution were applied on the adhesive just above the thin copper plate mask. The adhesive was dissolved within minutes. A window-like opening will form in the adhesive layer. By removing the mask, a thin freestanding membrane supported by a frame-like adhesive will be fabricated. The surface was showered frequently by methanol to avoid any diffusion of the HCl solution, so that a 4×4 mm window-like was formed in the adhesive layer. The copper mask was removed, leaving a thin freestanding membrane supported by a frame-like adhesive. The sample was cleaned by Triehloroethyler, methanol and acetone. The epilayer is then cleaned by a proper solvent for the nonbonding materials used. The shape and the size of the frame can be determined by the mask.

Vacuum grease was selected as a nonbonding material in addition to the mask to isolate the epilayer(s) from any effect of the adhesive, regardless of the properties of the adhesive and its function, permanent or temporary. Vacuum grease (or similar material) has no mechanical, chemical, or thermal effects on the epilayer and it attaches the mask to the layer(s) without adhesion. Therefore, it will not leave any effect, components, or phase on the epilayer during the LLO and after the removal of the mask. In addition, it can be removed from the surface with no degradation to the surface of the film.

Durabond 950 metallic ceramic composite adhesive was selected because it is dissolved by HCl in a controllable manner so that a freestanding membrane with a frame-like support can be created. This frame can dissolve completely if desired. In addition, it is thermally robust and machinable. However, the selection of the frame-like adhesive depends on whether the adhesion is to be permanent or temporary, and electrically conductive or insulating.

Selection of the materials such as the nonbonding material, the mask, the adhesives, and the chemicals depend on the fabrication, the physical and the chemical conditions as well as the desired applications.

Figure 3:
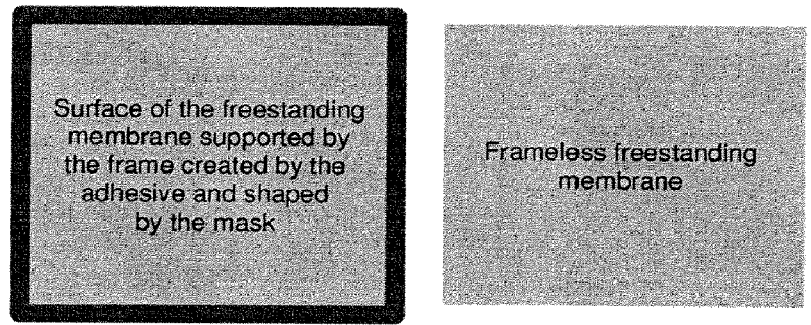
FIG. 3 illustrates schematically the fabrication of frameless self-supported freestanding GaN structure membrane by the nonbonding laser lift-off technique by two methods.
Figure 3:
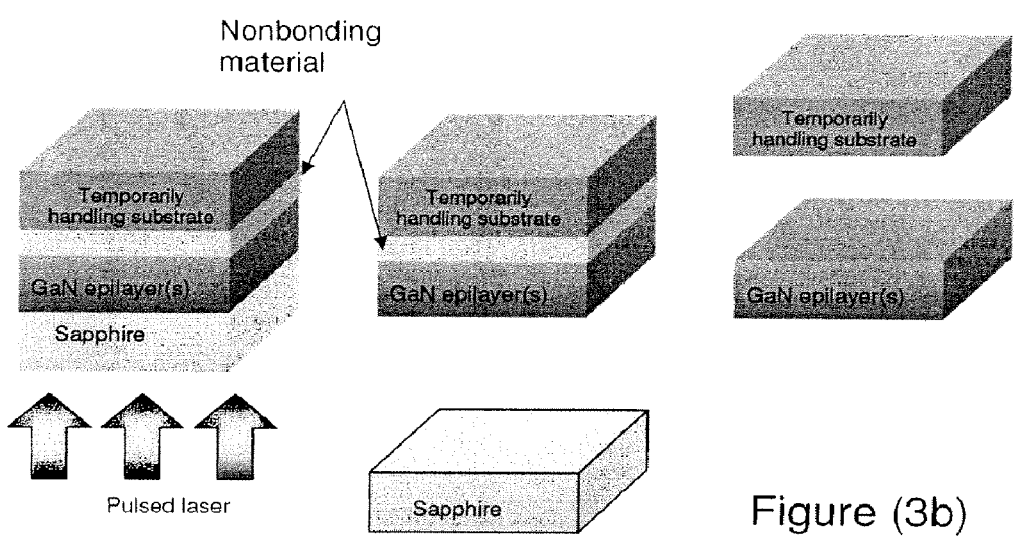

If integration with the upper layer or the original orientation of the epilayers is desirable, the frame-like adhesive around the freestanding membrane can dissolve then cut around the freestanding membrane. Both the adhesive and film around the freestanding membrane can be diced to obtain the frameless fully freestanding membrane. Another approach is to attach the temporarily handling substrate to the film surface by the nonbonding material (e.g. vacuum grease). The structure in this case is sapphire substrate/GaN epilayer(s)/nonbonding material/temporarily handling substrate. After the LLO, the temporary substrate can be removed to create a self-supported freestanding non-bonded-membrane as seen in the FIG. 3.

With proper selection and distribution of conductive adhesives, contact electrodes can be created for electronic and optoelectronic applications. Bonding methods still can be employed for the non-bonded freestanding membrane if needed. The method enables improvement in the optical design and allows for transmission applications by access to both sides of the structure without the involvement of a bonding layer and the receptor substrate, or the risk of leaving behind traces, components, phases, etc. from a bonding layer.

If desired, frameless freestanding membrane is possible to obtain using two techniques: (a) the frame-like adhesive around the freestanding membrane can dissolve then cut around the freestanding membrane or if applicable, both the adhesive and the film around the freestanding membrane can be dice to obtain the fully frameless freestanding membrane as seen in the FIG. 3a; b) another approach is to attach the temporarily handling substrate to the film surface by the nonbonding material. After the LLO, the temporary substrate can be removed to create a full size frameless self-supported freestanding non-bonded-membrane as seen in the FIG. 3b.

The advantages of the nonbonding LLO technique invention include: 1) the method eliminated the complexities of the bonding LLO methods and the restrictions on the selections of the bonding materials; 2) the nonbonding materials such as vacuum grease provided a gentle non-bonding attachment to the handling substrate with the structure and therefore, avoided any stiffness or mechanical stress on the layers; 3) any residual stress removed by the LLO is permanent; 4) the adhesive can serve as a supporting frame for the thin freestanding epilayers membrane. The size and the properties of this frame are subject to the desire application; 5) if desired, frameless freestanding membrane is possible to obtain using two techniques: (a) the frame-like adhesive around the freestanding membrane can dissolve then cut around the freestanding membrane or if applicable, both the adhesive and the film around the freestanding membrane can be dice to obtain the fully frameless freestanding membrane as seen in the FIG. 3a. (b) Another approach is to attach the temporarily handling substrate to the film surface by the nonbonding material. After the LLO, the temporary substrate can be removed to create a full size frameless self-supported freestanding non-bonded-membrane as seen in the FIG. 3b; 6) since nonbonding material is used, the temporarily handling substrate can remove easily without any destructive effects on the epilayer. Practically, there is neither a bonding layer nor an attachment to the layers with another substrate; 7) heterogeneous integration to both sides of the epilayer(s) is possible without the sophisticated and expensive double transfer LLO process; 8) with proper selection and distribution of conductive adhesives, contact electrodes can created for electrical, electronic and optoelectronic applications and bonding methods still can be employed; 9) the nonbonding LLO method enables improvement in the optical and electronics designs since acess to both sides is possible without the involvement of traces, components, or phases that might leave behind if a bonding material is used; 10) the method allows transmission applications by access to both sides of the structure without the involvement of a substrate, components, or phases that may leave behind if a bonding material is used; 11) the method could apply for large size and wafer size epilayers; and 12) LLO technology required a relatively expensive tools and special experience that might not affordable to small and medium size companies as well as most research labs. The nonbonding LLO technique however provides freestanding membranes at much lower cost than the double transfer LLO. Theses membranes has many applications such as substrate for further III-nitride growth, heterogeneous integration, packaging, Microsystems, thin film pattern, etc.

With proper selection and distribution of conductive adhesives, contact electrodes can be created for electronic and optoelectronic applications. Bonding methods still can be employed for the nonbonding freestanding membranes if needed. The method enables improvement in the optical design and allows transmission applications by access to both sides of the structure without the involvement of a bonding layer and the receptor substrate, or the risk of leaving behind traces, components, phases, etc. from a bonding layer.

What is claimed is:

1. A process for producing heterostructure membranes, comprising:
    attaching a mask to an area at a center of a most-upper of a plurality of AlGaN layers in a heterostructure on a sapphire substrate using a nonbonding material;
    attaching a microscope slide to the mask using an adhesive that provides support for the heterostructure during a laser lift-off without bonding to the plurality of AlGaN layers; and
    performing a laser lift-off of the sapphire substrate from the plurality of AlGaN layers.

2. The process of claim 1, wherein the AlGaN layers comprise an AlGaN heterostructure.

3. The process of claim 2, wherein the AlGaN heterostructure has a GaN layer attached to the sapphire substrate.

4. The process of claim 1, wherein the mask comprises an aluminum layer.

5. The process of claim 1, wherein the step of performing laser lift-off further comprises performing laser lift-off with an excimer laser.

6. The process of claim 1, further comprising applying a layer of vacuum grease between the mask and the most-upper of the plurality of AlGaN layers.

7. A method of producing an AlGaN heterostructure membrane, comprising:
    providing a plurality of heterogenous AlGaN layers upon a GaN layer upon a sapphire layer;
    applying a layer of vacuum grease to a portion of an upper AlGaN layer of the plurality of heterogenous AlGaN layers;
    masking at least a portion of the greased portion of the upper AlGaN layer to define a masked portion of the upper AlGaN layer;
    applying an adhesive to the upper AlGaN layer;
    applying a foil covered slide to the adhesive to enable handing of the AlGaN heterostructure;
    irradiating the sapphire layer with a laser beam until separation between the GaN layer and the sapphire layer occurs.

8. The method of claim 7, further comprising removing the foil covered slide, adhesive, mask, and vacuum grease from the upper AlGaN layer.

9. The method of claim 7, wherein irradiating the sapphire layer further comprises irradiating the sapphire layer with an excimer laser fluence to about 400 mJ/cm$^2$.

10. The method of claim 7, wherein the sapphire layer is irradiated with at a wavelength of about 248 nm.

11. The method of claim 7, wherein the mask comprises copper.

12. The method of claim 7, wherein the mask is applied in a framed configuration around a substantial portion of the AlGaN heterostructure.

* * * * *